(12) United States Patent
Jeon

(10) Patent No.: US 7,862,735 B2
(45) Date of Patent: Jan. 4, 2011

(54) METHOD FOR FORMING CONTACT HOLE ON SEMICONDUCTOR DEVICE

(75) Inventor: Haeng Leem Jeon, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 710 days.

(21) Appl. No.: 11/752,609

(22) Filed: May 23, 2007

(65) Prior Publication Data

US 2007/0272656 A1 Nov. 29, 2007

(30) Foreign Application Priority Data

May 24, 2006 (KR) .................. 10-2006-0046536

(51) Int. Cl.
*C03C 15/00* (2006.01)
*H01L 21/302* (2006.01)
(52) U.S. Cl. .................. 216/41; 438/717; 438/736
(58) Field of Classification Search .................. 216/41, 216/58, 83, 12; 438/736, 942, 717
See application file for complete search history.

(56) References Cited

U.S. PATENT DOCUMENTS

| 5,422,205 | A | * | 6/1995 | Inoue et al. | 430/5 |
| 5,573,634 | A | * | 11/1996 | Ham | 438/700 |
| 7,399,709 | B1 | * | 7/2008 | Lin et al. | 438/710 |
| 2002/0015900 | A1 | * | 2/2002 | Petersen | 430/5 |
| 2003/0215736 | A1 | * | 11/2003 | Oberlander et al. | 430/270.1 |

OTHER PUBLICATIONS

Mack, Chris A. Field Guide to Optical Lithography. SPIE- International Society for Optical Engineering. Washingon, 2006, p. 38.*

* cited by examiner

*Primary Examiner*—Binh X Tran
*Assistant Examiner*—Patti Lin
(74) *Attorney, Agent, or Firm*—Sherr & Vaughn, PLLC

(57) ABSTRACT

A method of forming a relatively fine contact hole using two masks. The two masks may have only their edge portions open, which may overlap each other.

8 Claims, 6 Drawing Sheets

METHOD FOR FORMING CONTACT HOLE ON SEMICONDUCTOR DEVICE

This application claims the benefit of the Korean Patent Application No. 10-2006-0046536, filed on May 24, 2006, which is hereby incorporated by reference in its entirety.

BACKGROUND

In some areas of semiconductor manufacturing, ultra highly-integrated devices may be implemented having a minimized design rule, which may require a circuit critical dimension (CD) to be minimized. As structures of semiconductor layers and patterns may be relatively complicated, connecting (e.g. contacting) layers to each other may be necessary. Connecting layers to each other may use contacts of a metallic material (e.g. tungsten (W) or copper (Cu)).

Some semiconductor device sizes have become relatively small due to nanotechnology, which may require relatively fine contacts. There are different kinds of fine contacts, which may be classified into direct contacts, word line contacts, bit line contacts, plate electrode contacts, reflow contacts, and other similar contacts. Direct contacts expose a surface of a semiconductor substrate. Word line contacts expose the top of a gate electrode.

FIGS. 1A through 1F illustrate a method of forming a reflow contact. As illustrated in example FIG. 1A, a prime process may be performed by putting a wafer substrate 1 on a hot plate of approximately 80° C. and treating it with hexamethyl-di-silazane (HMDS) for approximately 10 seconds. In a prime process, the adhesive strength between a photo resist (PR) pattern and the wafer substrate 1 may be increased, to prevent the PR pattern from shifting (e.g. do to lack of traction) during manufacturing processes.

As illustrated in example FIG. 1B, a positive PR 2 may be formed on the top surface of wafer substrate 1. Positive PR 2 may have a thickness between approximately 0.2 μm and 0.5 μm. A solvent in PR 2 may be removed by performing a soft bake on the hot plate between approximately 90° C. and 110° C. for approximately 90 seconds.

As illustrated in example FIG. 1C, PR 2 may be exposed with energy (e.g. between approximately 5 mJ/cm$^2$ to 50 mJ/cm$^2$) through mask 3. A region of PR 2 that is not exposed with energy may be covered by a pattern of Cr 4 on mask 3.

As illustrated in example FIG. 1D, PR 2 may be subjected to a post-exposure bake (PEB) on a plate (e.g. having a temperature between approximately 90° C. and 130° C. for approximately 90 seconds). As illustrated in example FIG. 1E, the PR 2 may be developed by an alkali solution, such that only an unexposed region of the PR 2 remains, thus resulting in a PR pattern.

As illustrated in example FIG. 1F, PR pattern 2 may be flowed by a flow bake. A flow bake may have a temperature higher than a soft bake. By the flow bake, the size of a contact hole 5 in PR 2 may be reduced. The manner of the flow bake may be different depending on the type PR 2 used. As an example, a flow bake may be performed at temperatures between approximately 120° C. and 150° C. for approximately 90 seconds.

A process illustrated in example FIGS. 1A through 1F may limit the size of a contact hole to more than 90 nm. Further, scum may remain when patterning a contact hole using the process illustrated in example FIGS. 1A through 1F, which may cause non-uniformly sized contact holes that may not be reproducible. For example, if the intensity of light in an exposing process does not reach a certain threshold, a PR may not be precisely formed, causing formation of contact holes having undesired sizes.

SUMMARY

Embodiments relate to a method of forming a relatively fine contact hole using two masks. The two masks may have only their edge portions open, which may overlap each other.

Embodiments relate a method of forming a contact hole in a semiconductor device, including at least one of the following steps: Forming a photo resist film over a wafer substrate. Performing a first patterning process on the photo resist film, using a first mask covered by a metallic material, with a first edge portion of the first mask being open. Performing a second patterning process on the photo resist film, using a second mask covered by a metallic material, with a second edge portion of the second mask being open, thereby forming a photo resist pattern corresponding to the overlapping area between the first and second edge portions. Forming a contact hole in the semiconductor device by exposing light on an area where the contact hole is to be formed, using the photo resist pattern as a mask. Removing the photo resist pattern.

DESCRIPTION OF THE DRAWINGS

Example

Example

Example

Example

Example

Example

DESCRIPTION

Figure 1A:
FIGS. 1A through 1F are cross-sectional views illustrating a process of forming a contact hole by a reflow process.
Figure 1B:
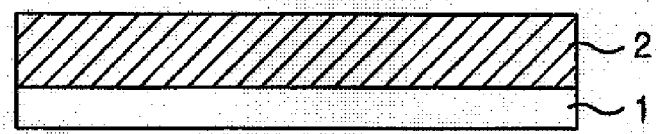
Figure 1C:
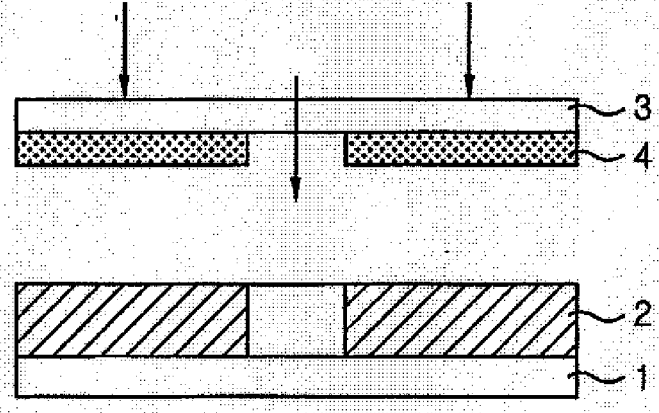
Figure 1D:
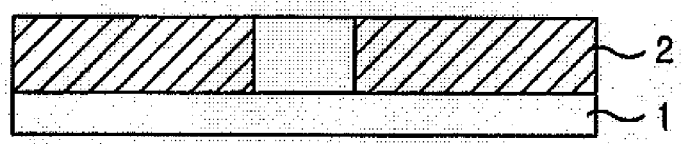
Figure 1E:
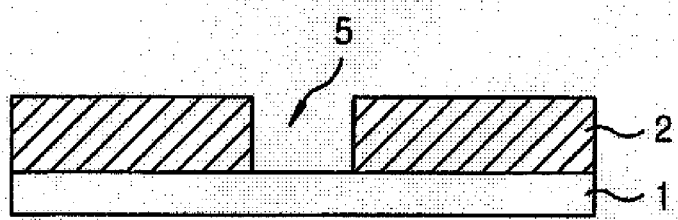
Figure 1F:
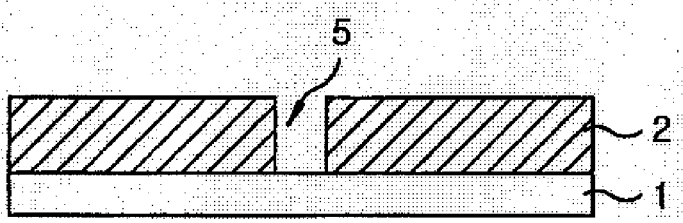
Figure 2A:
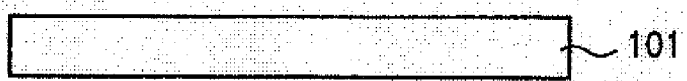
FIGS. 2A through 2G are cross-sectional views illustrating a process of forming a contact hole in a semiconductor device, in accordance with embodiments.
Figure 2B:
Figure 2C:
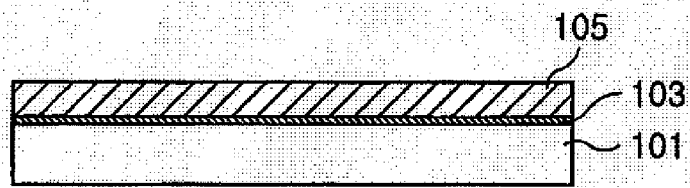
Figure 2D:
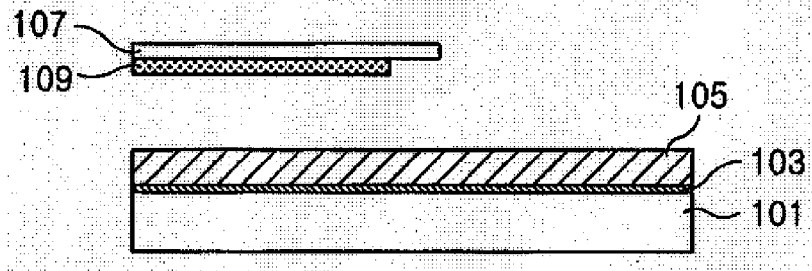

As illustrated in example FIGS. 2A through 2C, in accordance with embodiments, a bottom anti reflective coating (BARC) 103 and a positive PR 105 are formed over a wafer substrate 101. As illustrated in example FIG. 2D, in accordance with embodiments, a first patterning process is performed using a first mask 107 having an edge portion open by metallic material 109. As illustrated in example FIG. 2E, in accordance with embodiments, after a first patterning process and before a developing process, a second patterning process is performed using a second mask 111 having an edge portion open of metallic material 113. As illustrated in example FIG. 2E, open areas of first mask 107 and second mask 111 overlap, in accordance with embodiments.

Figure 2E:
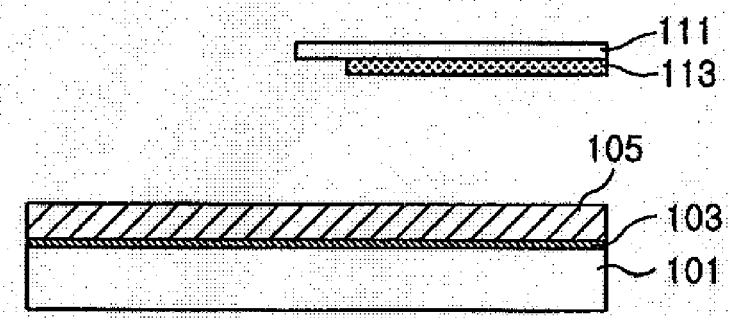
Figure 2F:
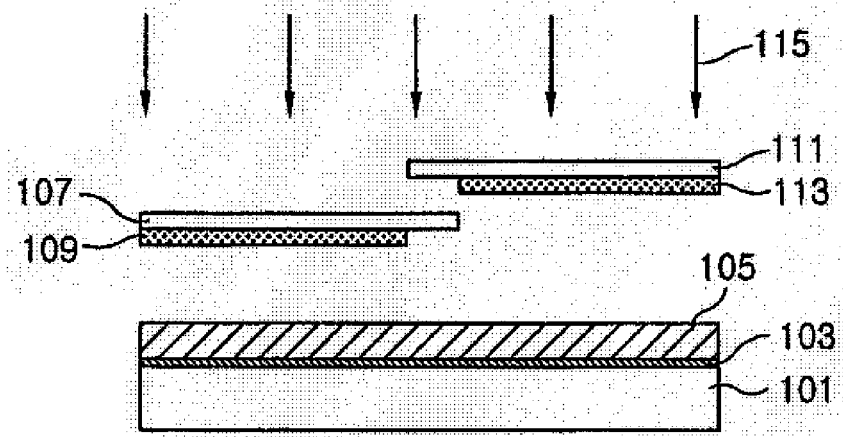

As illustrated in example FIG. 2F, PR 105 is exposed to light through first mask 107 and second mask 111 in a developing process, in accordance with embodiments. The region of PR 105 covered with the metallic materials 109 and 113 of the masks 107 and 111 may not be exposed to the light, as metallic materials 109 and 113 substantially block the light. In a developing process, a contact hole 117 may be formed having a relatively small dimension. In embodiments, contact hole 117 may be formed smaller than the resolution of the implemented semiconductor process. For example contact hole 117 may have a width of approximately 10 nm.

As illustrated in example FIG. 2A, in accordance with embodiments, a prime process may be performed by putting a wafer substrate 101 on a hot plate (e.g. having a temperature of approximately 80° C.) and treating it with hexa-methyl-disilazane (HMDS) (e.g. for approximately 10 seconds). A prime process may be performed to increase the adhesive strength between BARC 103, photo resist (PR) 105, and wafer substrate 101, so that the PR can be prevented from shifting in the manufacturing process.

As illustrated in example FIG. 2B, BARC 103 may be formed over wafer substrate 101, in accordance with embodiments. As illustrated in example FIG. 2C, a positive PR 105 may be formed (e.g. having a thickness between approximately 0.2 µm and 0.5 µm) over BARC 103. A solvent in PR 105 may be removed by performing a soft bake (e.g. on a hot plate having a temperature between approximately 90° C. and 110° C. for approximately 90 seconds) As illustrated in example FIG. 2D, a first patterning process may be performed using a first mask 107, in accordance with embodiments. First mask 107 may be partially covered with metallic material 109 (e.g. chrome (Cr)), such that an edge portion of first mask 107 is open.

As illustrated in example FIG. 2E, prior to a developing process being performed and after a first patterning process, a second patterning process may be performed by using a second mask 111, in accordance with embodiments. Second mask 111 may be partially covered with metallic material 113 (e.g. Cr), such that an edge portion of second mask 111 is open.

As illustrated in example FIG. 2F, first mask 107 and second mask 111 overlap, in accordance with embodiments. Open areas (i.e. where metallic material 109 and 113 are not formed on first mask 107 and second mask 111) may overlap. As illustrated in example FIGS. 2F and 2G, a developing process may be performed using first mask 107 and second mask 111 to form a contact hole pattern 117 in PR 103. Contact hole pattern 117 may be defined by the overlapping of the open areas of first mask 107 and second mask 111, in accordance with embodiments.

Figure 3A:
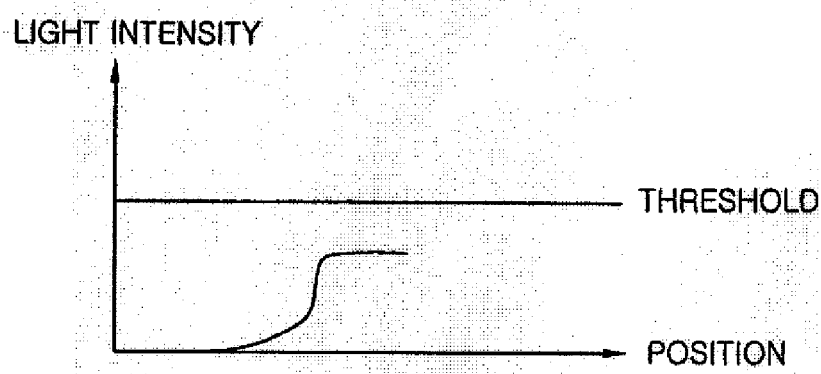
FIGS. 3A and 3B are graphs illustrating example profiles of light intensity passing through a first and a second mask, respectively, in accordance with embodiments.

Example FIG. 3A, in accordance with embodiments, illustrate example profiles of light intensity in a developing process resulting from a first patterning process and a second patterning process. Example FIG. 3A illustrates an example profile of light resulting from a first patterning process (e.g. first mask 107 and metallic material 109). Example FIG. 3B illustrates an example profile of light resulting from a second patterning process (e.g. second mask 111 and metallic material 113).

Figure 3B:
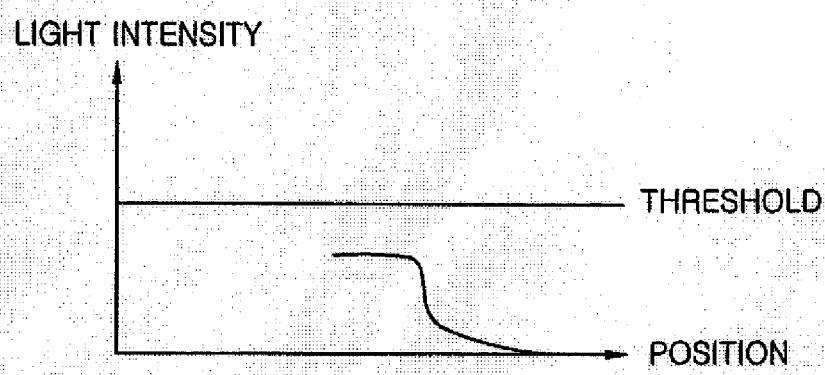
Figure 3C:
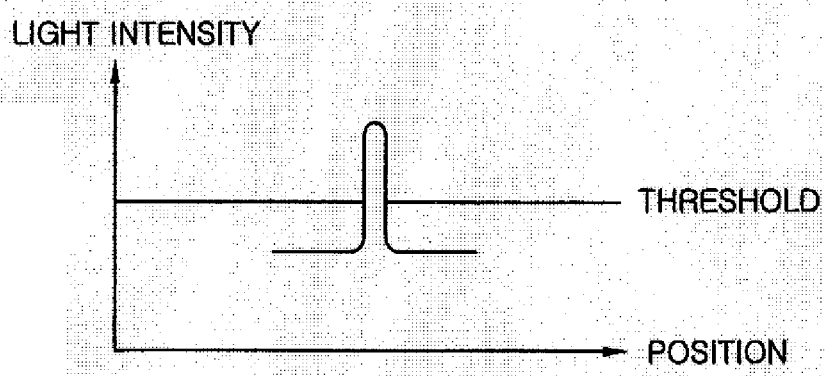
FIG. 3C is a graph illustrating an example profile of a sum of the light intensities passing through a first and second mask, in accordance with embodiments.

As illustrated in FIGS. 3A and 3B, metallic materials (e.g. metallic materials 109 and 113) selectively block enough light in a developing process to allow for selective developing of a photo resist (e.g. PR 105). In other words, metallic materials may block enough light so that the amount of light that does pass through the metallic materials is below the threshold necessary to develop a photo resist. As illustrated in example FIG. 3C, the sum of the two light intensities from FIGS. 3A and 3B (e.g. which may be the effective result of using both first mask 107 and second mask 111 in a developing process) may have a relatively narrow and relatively sharp shape, which may be used to develop a contact hole pattern in a photo resist having a relatively narrow and relatively sharp shape.

Figure 4A:
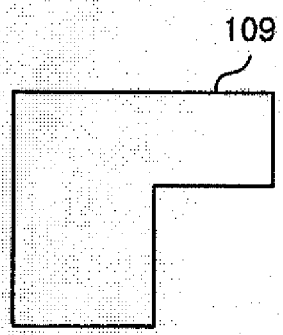
FIGS. 4A and 4B are plan views illustrating shapes of the first and the second mask, in accordance with embodiments.
Figure 4B:
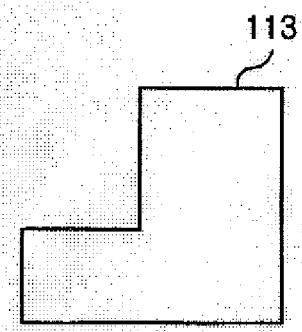
Figure 4C:
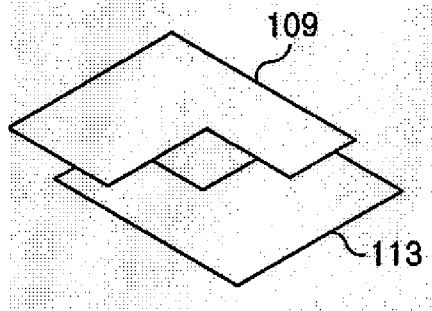
FIG. 4C is a perspective view illustrating overlapping of a first and second mask, in accordance with embodiments.

As illustrated in example FIGS. 4A and 4B, the shapes of the first mask 109 and the second mask 113 (e.g. which may have open edge portions that are not covered with the metallic materials 109 and 113) are illustrated, in accordance with embodiments. Example FIG. 4C illustrates, in accordance with embodiments, the overlapping of first mask 109 and second mask 113. However, one of ordinary skill in the art would appreciate other shapes and manners of overlapping without departing from the scope and spirit of the embodiments.

In embodiments, PR 105 is exposed by light having energy of approximately 5 mJ/cm$^2$ to 50 mJ/cm$^2$ in a developing process. However, in the developing process, light may be substantially blocked under areas of masks 107 and 111 that metallic materials 109 and 113 are formed. Accordingly, in accordance with embodiments, PR 105 can be selectively developed (i.e. patterned) to form relatively small patterns.

Figure 2G:
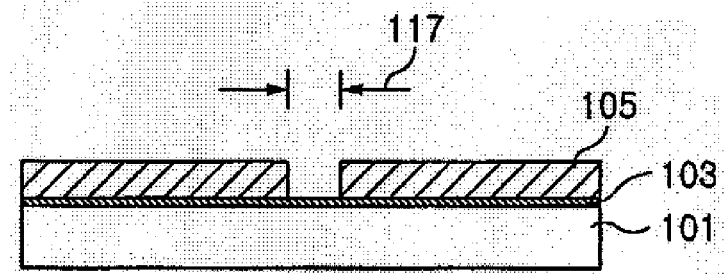

As illustrated in example FIG. 2G, in accordance with embodiments, PR 105 may be subjected to a post-exposure bake (PEB) on a hot plate (e.g. having a temperature of approximately 90° C. to 130° C. for approximately 90 seconds). PR 105 may then be further developed by an alkali solution, removing the region of PR 105 that was not exposed to light (e.g. illustrated in FIG. 2F). In conformance with the intensity profile of FIG. 3C, a waveform having a size narrower than the resolution of the underlying semiconductor process may be realized. As illustrated in FIG. 2G, contact hole 117 may be formed to have a dimension of approximately 10 nm, in accordance with embodiments.

Accordingly, when forming a contact hole, a fine contact hole may be formed down to minimum 10 nm by sequentially using two masks each having an opened edge portion, in accordance with embodiments. Since a contact hole formed using a single mask may be limited to a minimum dimension 90 nm, a contact hole having a dimension of 10 nm may be a significant improvement, in accordance with embodiments. In embodiments, a contact hole with a dimension of approximately 10 nm may prevent the formation of scum, thus making the shape of the contact hole good, uniform, and reproducible, which may be unlike a contact hole having a 90 nm dimension formed from a single mask.

While the invention has been shown and described with respect to certain embodiments, it will be understood by those skilled in the art that various changes and modifications may be made without departing from the spirit and scope of the embodiments as defined in the following claims.

What is claimed is:

1. A method comprising:

forming a photo resist film over a wafer substrate;

performing a first patterning process over the photo resist film using a first mask, wherein the first mask is partially covered by a first metallic material leaving an first edge of the first mask open from the first metallic material;

performing a second patterning process over the photo resist film using a second mask, wherein the second mask is partially covered by a second metallic material leaving an second edge of the second mask open from the second metallic material, wherein the first edge and the second edge overlap; and using the overlap of the first edge and the second edge to selectively expose the photo resist film to light, wherein at least one of the first metallic material and the second metal material comprises Cr, and wherein the second patterning process is performed after the first patterning process, and the second patterning process is performed before said using the overlap to selectively expose the photo resist film to light.

2. The method of claim 1, wherein the light has an energy between approximately 5 mJ/cm$^2$ to 50 mJ/cm$^2$.

3. The method of claim 1, wherein the intensity of light passing through the overlap of the first edge and the second edge is greater than or equal to a threshold intensity which can pattern the photo resist film.

4. The method of claim 1, comprising forming a bottom anti reflective coating over the wafer substrate, wherein the photo resist film is formed over the bottom anti reflective coating.

5. The method of claim 1, further comprising removing a portion of the photo resist film that was not exposed to light.

6. The method of claim 5, wherein said removing comprises developing using an alkali solution.

7. The method of claim 5, further comprising:

forming a contact hole using the photo resist pattern as a mask; and removing the photo resist pattern.

8. The method of claim 7, wherein the contact hole is formed with a size of at least approximately 10 nm.

* * * * *